US005892183A

United States Patent [19]

Roozen et al.

[11] Patent Number: 5,892,183
[45] Date of Patent: Apr. 6, 1999

[54] LOUDSPEAKER SYSTEM HAVING A BASS-REFLEX PORT

[75] Inventors: Nicolaas B. Roozen; Jozef E. M. Vael; Joris A. M. Nieuwendijk, all of Eindhoven, Netherlands

[73] Assignee: U.S. Philips Corporation, New York, N.Y.

[21] Appl. No.: 31,372

[22] Filed: Feb. 26, 1998

[30] Foreign Application Priority Data

Jul. 26, 1997 [EP] European Pat. Off. .............. 97202358

[51] Int. Cl.[6] ...................... H05K 5/00
[52] U.S. Cl. ...................... 181/156
[58] Field of Search ...................... 181/148, 156, 181/152, 199, 160; 381/154, 159

[56] References Cited

U.S. PATENT DOCUMENTS

| | | | |
|---|---|---|---|
| 4,213,515 | 7/1980 | Laupman | 181/156 |
| 4,284,166 | 8/1981 | Gale | 181/156 |
| 4,987,601 | 1/1991 | Goto | 181/156 |
| 5,623,132 | 4/1997 | Gahm | 181/156 |
| 5,714,721 | 2/1998 | Garoronski et al. | 181/156 |

FOREIGN PATENT DOCUMENTS

| | | |
|---|---|---|
| 0361445 | 4/1990 | European Pat. Off. . |
| WO9011668 | 10/1990 | France . |
| 2045578 | 10/1980 | United Kingdom . |

*Primary Examiner*—Khanh Dang
*Attorney, Agent, or Firm*—Edward W. Goodman

[57] ABSTRACT

A loudspeaker system includes an enclosure (1) which accommodates a loudspeaker device (3) and a bass-reflex port (5) having two open ends (5*b*, 5*c*). The port has a longitudinal axis (5*a*) and a length (L) defined by the two open ends, and has a passage which flares towards the two open ends. This provides flared portions (5*d*, 5*e*) which extend over a substantial part of the length of the port. In order to minimize undesirable noises and distortions, the flared portions, in a longitudinal section of the port, have bounding lines (7) which extend at an angle α having a value of between 3° and 12° with respect to the longitudinal axis of the port.

6 Claims, 3 Drawing Sheets

LOUDSPEAKER SYSTEM HAVING A BASS-REFLEX PORT

BACKGROUND OF THE INVENTION

1. Field of the Invention

The invention relates to a loudspeaker system comprising an enclosure which accommodates a loudspeaker device and a bass-reflex port having two open ends, this port having a longitudinal axis and a length defined by the two open ends, and having a passage which flares towards the two open ends, flared portions being present, these flared portions extending over a substantial part of the length of the port.

2. Description of the Related Art

A bass-reflex port is essentially an open duct by means of which an internal volume of a loudspeaker enclosure communicates with the medium outside the enclosure, a first open end being situated inside the enclosure and a second open end being situated outside the enclosure. Such a port enhances the sound reproduction in the lower range of the frequency spectrum. The effect of the bass-reflex port is based on the Helmholtz resonator principle, which is known per se, the frequency of the reproduced sound being dependent on the volume of the enclosure, the length and cross-section of the port and the velocity of sound. Small loudspeaker enclosures require a port of comparatively small cross-section. However, in order to obtain the same sound pressure at or near the Helmholtz frequency in a small enclosure as in a large enclosure, it is necessary that, per unit of time, the same amount of air flows through the port. This means that the flow velocity of the air in the port is comparatively high for a small enclosure. It has been found that when known bass-reflex ports are used, these ports having a constant cross-section, a high sound level at or near the Helmholtz frequency is accompanied by noises, acoustic losses and distortions of the sound.

International Application WO-A 90/11668 discloses a loudspeaker system, which comprises a bass-reflex cabinet with a loudspeaker and a duct. The duct provides the communication between the interior and the exterior of the cabinet and constitutes an adapter of converging-diverging longitudinal section. Shapes proposed for the adapter are conical, exponential and hyperbolic profiles, the asymptote to the adapter being required to extend at an angle of between 30° and 50° with respect to the longitudinal direction. The adapter used in the known loudspeaker system serves to take the place of a duct of constant cross-section.

SUMMARY OF THE INVENTION

It is an object of the invention to propose measures which result in an improvement of the loudspeaker system of the type defined in the opening paragraph.

To this end, the loudspeaker in accordance with the invention is characterized in that in a longitudinal section of the port, said flared portions have bounding lines which extend at an angle having a value of between 3° and 12° with respect to the longitudinal axis of the port. Thus, the port used therein has inner walls which are slightly inclined with respect to the longitudinal axis of the port.

Surprisingly, it has been found that the loudspeaker system in accordance with the invention has a higher sound reproduction level at low frequencies and produces considerably less noises than the known loudspeaker systems. A reason found for this is that the air stream can follow the slightly inclined inner walls of the port for a long time without the passing air being separated from the wall. As a result of this, annoying vortex motions of the air, and noises and distortions attending these vortex motions, can be minimized. The port used, in which the flared portions extend to the proximity of the open ends, can be of round, specifically circular, cross-section.

An embodiment of the loudspeaker system in accordance with the invention is characterized in that said angle is 6°, maximum. Experiments have shown that a value of between 3° and 6° produces only minimal noises at the Helmholtz frequency, particularly, if the bass-reflex port has a length dimension and a smallest diameter of the order of magnitude of 13 cm and 2 cm, respectively, while the volume of the enclosure is comparatively small, for example, 2.5 $dm^3$.

An embodiment of the loudspeaker system in accordance with the invention is characterized in that in a longitudinal section, the port has bounding lines of parabolic shape. In this embodiment, the bounding lines of said flared portions consequently have a parabolic shape. It has been found that, in the case of the gradual increase in cross-section towards both open ends obtained in this specific manner, the air which passes through the port follows the walls of the port.

An embodiment of the loudspeaker system in accordance with the invention is characterized in that both open ends of the port have end portions which are radially rounded towards the exterior. The rounded end portions in conjunction with the above-noted measures ensure that, as the air leaves the port, the air remains on the wall for such a long time that separation does not take place until an area is reached where the air velocity has already decreased considerably. For realistic air velocities in the port, this only results in comparatively slight turbulences near the ends of the port, which only give rise to minimal noises. Since the air stream is pulsating, i.e., constantly changes direction, it is important that both open ends are rounded. It has been found that best results are achieved if the rounded end portions have a radius of between 3 and 12 mm. Moreover, it has been found that rounding at one end has hardly any effect.

In an embodiment of the loudspeaker system in accordance with the invention, the rounded end portions at both open ends, these portions adjoining the slightly inclined inner walls, change into flanges situated outside the port, for example, flanges which are oriented transversely to the longitudinal axis of the port. The measure used in this embodiment may yield a further improvement of the loudspeaker system at given sound levels. One of the flanges can be integrated in a wall portion of the enclosure.

BRIEF DESCRIPTION OF THE DRAWINGS

The invention will be described in more detail, by way of example, with reference to the drawings, in which.

DESCRIPTION OF THE PREFERRED EMBODIMENTS

Figure 1:
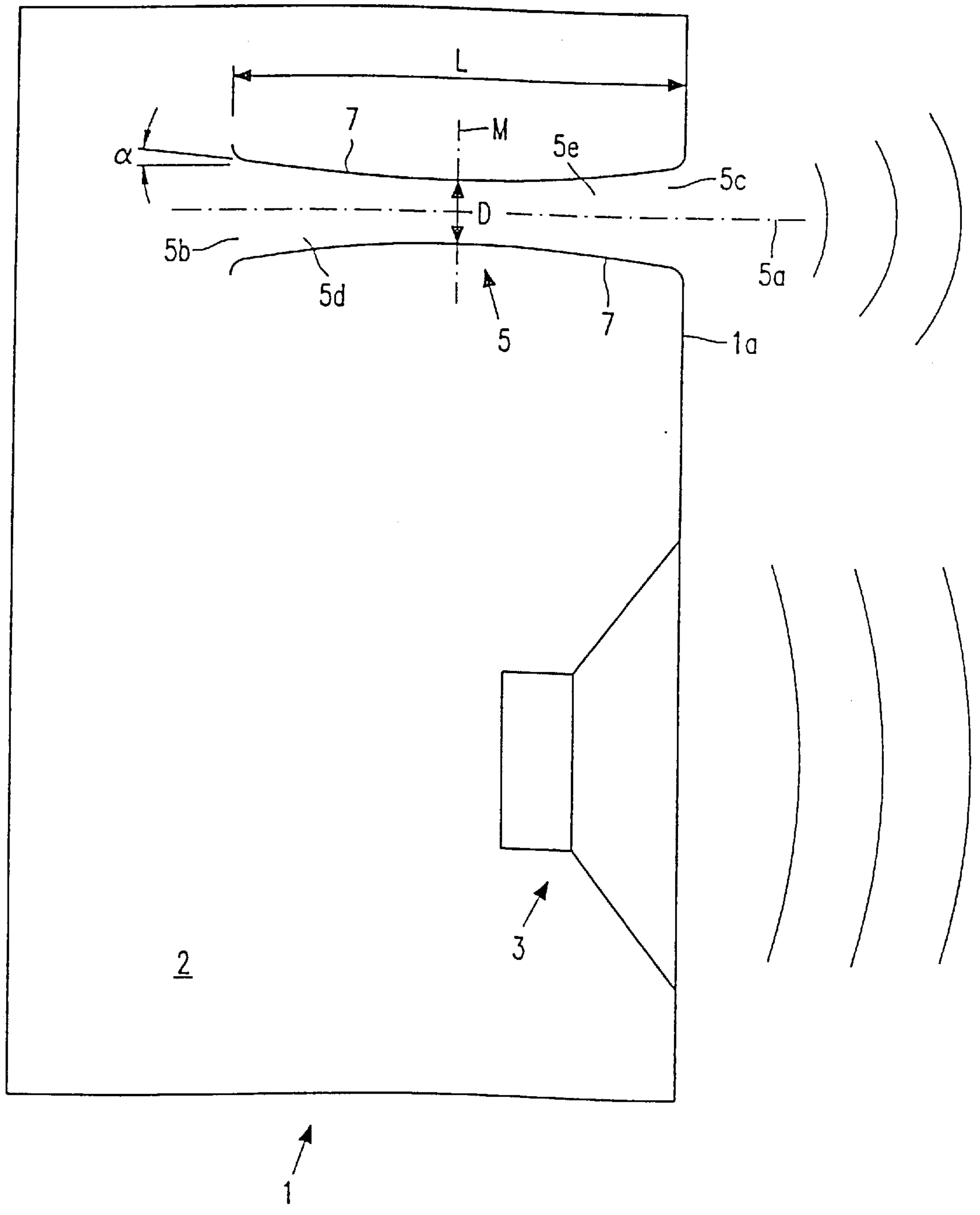
FIG. 1 diagrammatically shows an embodiment of the loudspeaker system in accordance with the invention.

The loudspeaker system, in accordance with the invention shown in FIG. 1, comprises an enclosure 1 which accommodates a loudspeaker device 3, taking the form of a cone loudspeaker known per se, and a bass-reflex port 5. The enclosure 1 forms a chamber 2 of a given volume, for example, 2.5 $dm^3$. The port 5, which provides open communication between the chamber 2 and the medium outside the enclosure, has a longitudinal axis 5*a* and two open ends 5*b* and 5*c*, of which one end 5*b* is situated inside the enclosure and the other end 5*c* is situated on or near a wall portion 1*a* of the enclosure 1. The port 5, in the present example, has a length L of 13 cm and a round cross-section having a minimum diameter D of 2 cm. The port 5 has a passage which flares towards the two open ends 5*b* and 5*c*, the port having bounding lines 7 of parabolic shape in longitudinal section. In the present example, this results in a flared portion 5*d* and a flared portion 5*e* at opposite sides of the center M of the port, these flared portions widening towards the open ends 5*b* or 5*c*, respectively, and extending over a substantial part of the port length L. The parabolic bounding lines 7 extend at an angle α of 12°, maximum with respect to the longitudinal axis 5*a*. The flared portions 5*d* and 5*e* extend in areas where the angle α has a value of between 3° and 12°. The comparatively small area near the center M, where the angle α is smaller than 3°, is not relevant for the desired effect, i.e., particularly the reduction of noises and distortions.

In the description of the bass-reflex port shown in FIGS. 2 through 5, parts and elements already described with reference to FIG. 1 use the same reference numerals.

Figure 2:
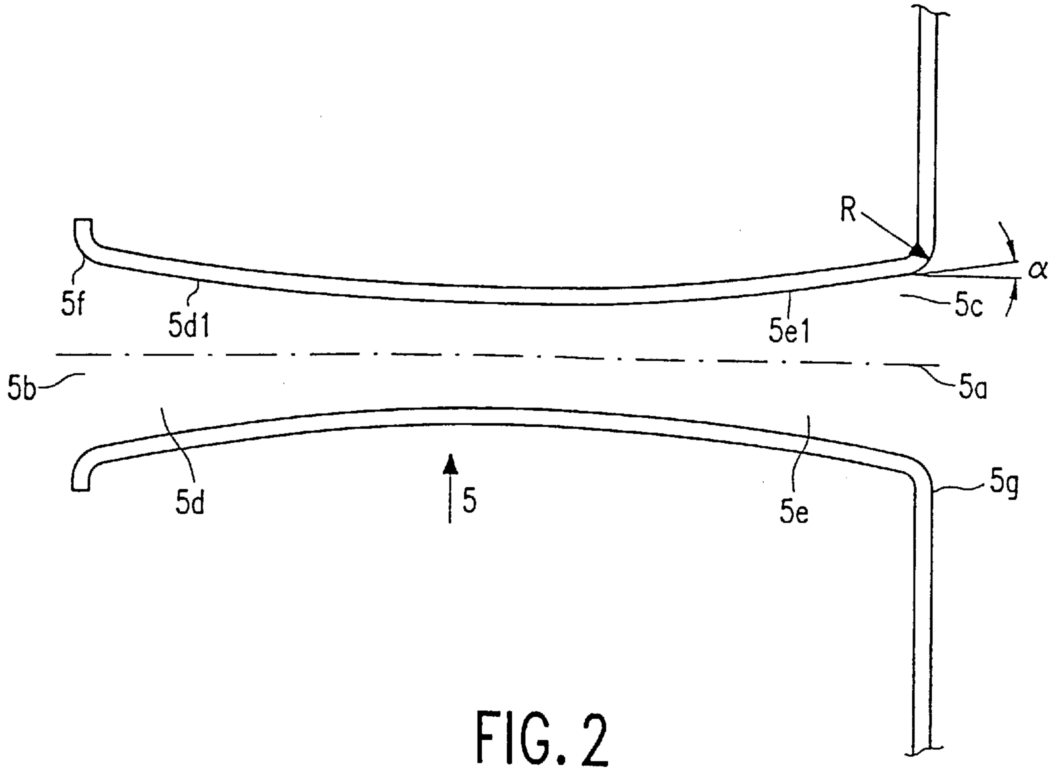
FIG. 2 diagrammatically shows a bass-reflex port used in the embodiment shown in FIG. 1.

Owing to the flared portions 5*d* and 5*e*, the bass-reflex port 5 shown in FIG. 2 has inner walls $5d_1$, and $5e_1$, respectively, which are slightly inclined with respect to the longitudinal axis 5*a*. In the present example, these walls extend at a maximum angle α of 6° with respect to the longitudinal axis 5*a* of the port 5. At both open ends 5*b* and 5*c*, the port 5 has end portions 5*f* and 5*g*, respectively, which are radially rounded towards the exterior and which, in the present example, have a radius R of 5 mm. A slightly smaller or greater radius of, preferably, between 3 and 12 mm, is also suitable. The rounded end portions 5*f* and 5*g* smoothly adjoin the gently inclined walls $5d_1$, and $5e_1$, respectively, the end portion 5*g*, in the present example, changing smoothly into the wall portion 1*a* of the enclosure.

Figure 3:
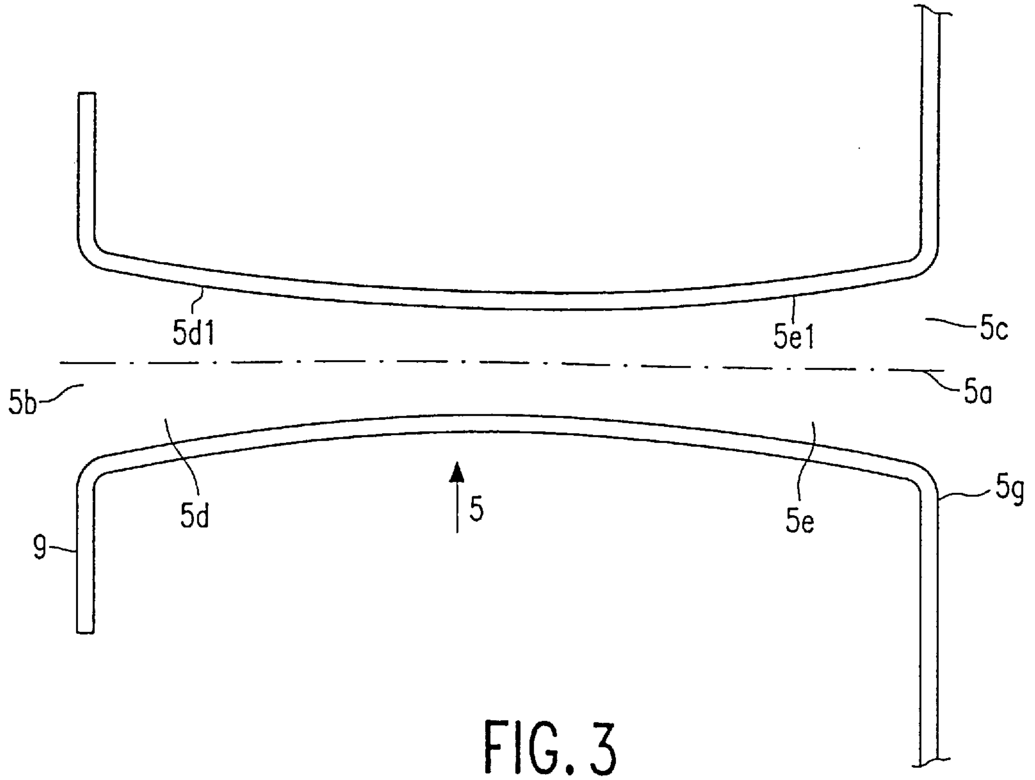
FIGS. 3, 4 and 5 diagrammatically show variants of the bass-reflex port.

The bass-reflex port 5 shown in FIG. 3 differs from the port 5 shown in FIG. 2 in that the rounded end portions 5*f* and 5*g* at the two open ends 5*b* and 5*c* change into flanges situated outside the port, one of the flanges being formed by the wall portion 1*a* of the housing 1. The other flange takes the form of a disc 9 having a central opening and oriented transversely to the longitudinal axis 5*a*.

Figure 4:
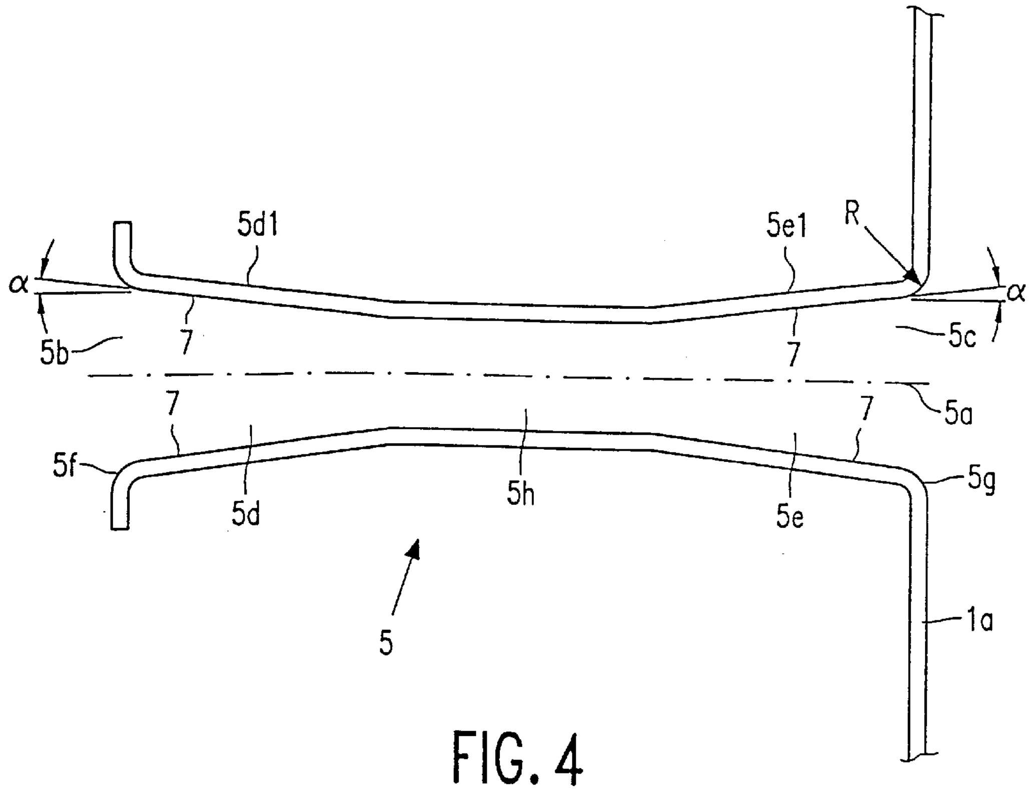
Figure 5:
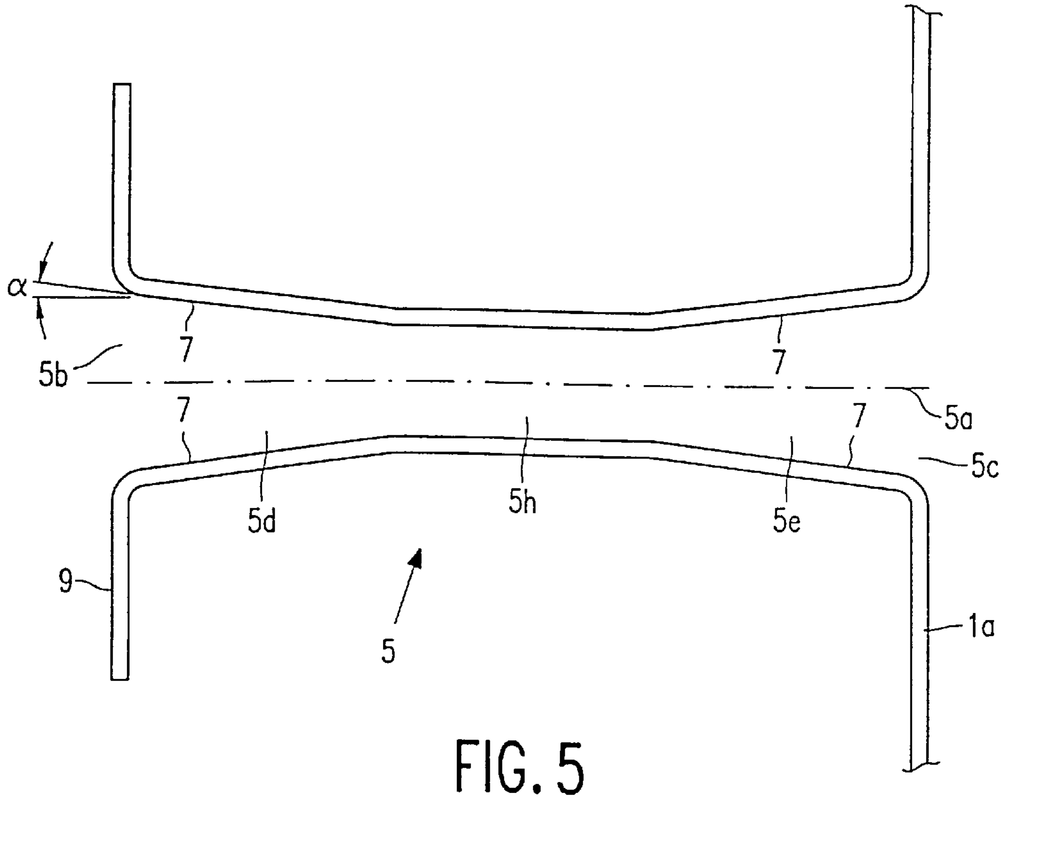

The bass-reflex ports 5 shown in FIGS. 4 and 5, which are intended for use in a loudspeaker system in accordance with the invention, comprise two flared portions 5*d* and 5*e*, which, in a longitudinal section of the port, have bounding lines 7 extending at a constant angle α of 7° with respect to the longitudinal axis 5*a* of the port. A slightly greater or smaller angle α of between 3° and 12° is also suitable. A cylindrical portion 5*h* extends in a central area situated between the flared portions 5*d* and 5*e*. In the present examples, each of the portions 5*d*, 5*e* and 5*h* extends over approximately one third of the port length. The two flared portions 5*d* and 5*e* are bounded by walls $5d_1$, and $5e_1$, respectively, which, at the open ends 5*b* and 5*c* of the port 5, change into rounded end portions 5*f* and 5*g*, respectively, having a radius R of, preferably, between 3 and 10 mm. In the variant shown in FIG. 4, the end portion 5*g* changes smoothly into the wall portion 1*a* of an enclosure. This is also the case in the variant shown in FIG. 5, but here the end portion 5*f* also changes smoothly into a flange 9.

It is to be noted that bass-reflex ports which differ from those shown but which meet the criteria defined the claims are possible.

We claim:

1. A loudspeaker system comprising:

an enclosure;

a loudspeaker device mounted within the enclosure; and a bass-reflex port having two open ends formed in the enclosure, said bass-reflex port having a longitudinal axis and a length defined by the two open ends, and having a passage flaring towards the two open ends, the bass-reflex port being provided with a central portion and two flared portions, each of said two flared portions extending between the central portion and one of the open ends of the bass-reflex port, each of said two flared portions extending over a part of the length of the bass-reflex port which is larger than the part of the length over which the central portion extends, characterized in that in a longitudinal section of the bass-reflex port, said two flared portions are defined by lines extending at an angle having a value of between 3° and 12° with respect to the longitudinal axis of the bass-reflex port.

2. A loudspeaker system as claimed in claim 1, characterized in that said angle is 6°, maximum.

3. A loudspeaker system as claimed in claim 1, characterized in that in a longitudinal section, the bass-reflex port has bounding lines parabolic in shape.

4. A loudspeaker system as claimed in claim 1, characterized in that both open ends of the bass-reflex port have end portions radially rounded towards an exterior of the bass-reflex port.

5. A loudspeaker system as claimed in claim 4, characterized in that the radially rounded end portions have a radius of between 3 and 12 mm.

6. A loudspeaker system as claimed in claim 4, characterized in that the rounded end portions change smoothly into flanges situated outside the bass-reflex port.

* * * * *